(12) United States Patent
Chang

(10) Patent No.: US 9,082,828 B2
(45) Date of Patent: Jul. 14, 2015

(54) AL BOND PAD CLEAN METHOD

(71) Applicant: Applied Materials, Inc., Santa Clara, CA (US)

(72) Inventor: Mei Chang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/055,947

(22) Filed: Oct. 17, 2013

(65) Prior Publication Data

US 2014/0113445 A1 Apr. 24, 2014

Related U.S. Application Data

(60) Provisional application No. 61/718,113, filed on Oct. 24, 2012.

(51) Int. Cl.
*H01L 21/768* (2006.01)
*H01L 21/02* (2006.01)
*H01L 23/00* (2006.01)
*H01L 21/3105* (2006.01)
*H01L 23/29* (2006.01)
*H01L 23/31* (2006.01)

(52) U.S. Cl.
CPC .... *H01L 21/76885* (2013.01); *H01L 21/02041* (2013.01); *H01L 21/02046* (2013.01); *H01L 21/02063* (2013.01); *H01L 21/31058* (2013.01); *H01L 23/291* (2013.01); *H01L 23/293* (2013.01); *H01L 23/3192* (2013.01); *H01L 24/11* (2013.01); *H01L 24/13* (2013.01); *H01L 24/03* (2013.01); *H01L 24/05* (2013.01); *H01L 2224/0401* (2013.01); *H01L 2224/05008* (2013.01); *H01L 2224/05011* (2013.01); *H01L 2224/05027* (2013.01); *H01L 2224/0558* (2013.01); *H01L 2224/05124* (2013.01); *H01L 2224/05144* (2013.01); *H01L 2224/05147* (2013.01); *H01L 2224/05155* (2013.01); *H01L 2224/05186* (2013.01); *H01L 2224/05572* (2013.01); *H01L 2224/05647* (2013.01); *H01L 2224/131* (2013.01); *H01L 2224/81022* (2013.01)

(58) Field of Classification Search
CPC ................... H01L 21/02041; H01L 21/02046; H01L 21/02057; H01L 21/0206; H01L 23/26; H01L 23/564; H01L 27/16498; H01L 31/186
USPC ....................... 438/612–617, 688; 257/E21.59
See application file for complete search history.

(56) References Cited

U.S. PATENT DOCUMENTS

| | | | |
|---|---|---|---|
| 2003/0155655 A1* | 8/2003 | Fitzsimmons et al. | 257/774 |
| 2004/0007779 A1* | 1/2004 | Arbuthnot et al. | 257/780 |
| 2004/0227242 A1* | 11/2004 | Noguchi et al. | 257/751 |
| 2012/0172211 A1* | 7/2012 | Lu et al. | 502/240 |

* cited by examiner

*Primary Examiner* — Thanhha Pham
(74) *Attorney, Agent, or Firm* — Patterson & Sheridan, LLP

(57) ABSTRACT

Embodiments of the present disclosure provide a method for controlling moisture from substrate being processed. Particularly, embodiments of the present disclosure provide methods for removing moisture from polymer materials adjacent bond pad areas. One embodiment of the present includes providing a moisture sensitive precursor and forming a compound from a reaction between the moisture to be controlled and the moisture sensitive precursor.

15 Claims, 3 Drawing Sheets

AL BOND PAD CLEAN METHOD

CROSS-REFERENCE TO RELATED APPLICATIONS

This application claims benefit of U.S. Provisional Patent Application Ser. No. 61/718,113 filed Oct. 24, 2012, which is herein incorporated by reference.

BACKGROUND

1. Field

Embodiments of the present disclosure relate to method for fabricating bond pads. More particularly, embodiments of the present disclosure provide methods for controlling moisture in polymer material during bond pad fabrication.

2. Description of the Related Art

During chip packaging, metal layers are used for connecting solder material to bond pads that are electrically connected to semiconductor devices. An insulating layer is usually formed over the bond pad and patterned to expose portions of the bond pad. The metal layers, such as under bump metallization (UBM) or redistribution layers, are then formed over the patterned insulating layer and the exposed bond pads.

Bond pads are usually made with a conductive material, such as aluminum, copper, tin, nickel, gold, or silver. For aluminum bond pads, polymer materials are increasingly used as the patterned insulating layer for UBM or redistribution layer. However, polymer materials typically contain large quantity of moisture. The moisture can contaminate freshly cleaned aluminum surfaces. Moisture contamination degrades contact resistance between the aluminum bond pads and the UBM or redistribution layers.

FIG. 1 is a prior art schematic side view of an under bump metallization structure 100 subjecting to contamination caused by moistures in an adjacent polymer material. During packaging, a polymer layer 108 is deposited over a dielectric layer 102 and a device interconnect layer 104 of a fabricated device. The polymer layer 108 may be patterned to form a trench or via structure 106 exposing a bond pad area 104a. Under bump metal layers 110, 114 and 116 are then formed over the trench or via structure 106 and a solder material 118 is deposited thereafter to electrically connect the device interconnect layer 104. However, before depositing the under bump metal layer 110, moisture contained in the polymer material 108 usually contaminates the metal in the exposed bond pad area 104a forming undesired contaminations 112 between the device interconnect layer 104 and the under bump metal layer 110. The contaminations 112 reduce electrical conductivity between the device interconnect layer 104 and the under bump metal layer 110.

Traditionally, cooling the substrate or cooling the processing chamber is used to reduce moisture in the polymer. However, the cooling method is time consuming and not effectively.

Therefore, there is a need for methods for removing moisture from polymer materials positioned adjacent aluminum bond pads.

SUMMARY

Embodiments of the present disclosure provide a method for removing moisture from substrate being processed. Particularly, embodiments of the present disclosure provide methods for removing moisture from polymer materials adjacent bond pad areas.

One embodiment of the present disclosure provides a method for processing a substrate. The method comprises removing moisture in one or more films on the substrate by providing a moisture sensitive precursor and forming a compound on the substrate from a reaction between the moisture in the one or more films and the moisture sensitive precursor.

Another embodiment of the present disclosure provides a method for forming under bump metal layers. The method comprises removing moisture from a polymer layer formed over a device interconnect layer. The polymer layer is patterned to expose a portion of the device interconnect layer, and removing moisture comprises providing a moisture sensitive precursor, and forming a compound from a reaction between the moisture in the polymer film and the moisture sensitive precursor. The method further comprises cleaning the exposed device interconnect layer with a plasma, and depositing one or more metal layers over the polymer layer and the exposed device interconnect layer.

Another embodiment of the present disclosure provides a method for removing moisture from a processing chamber. The method comprises flowing a moisture sensitive precursor to the processing chamber to react with moisture in the processing chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
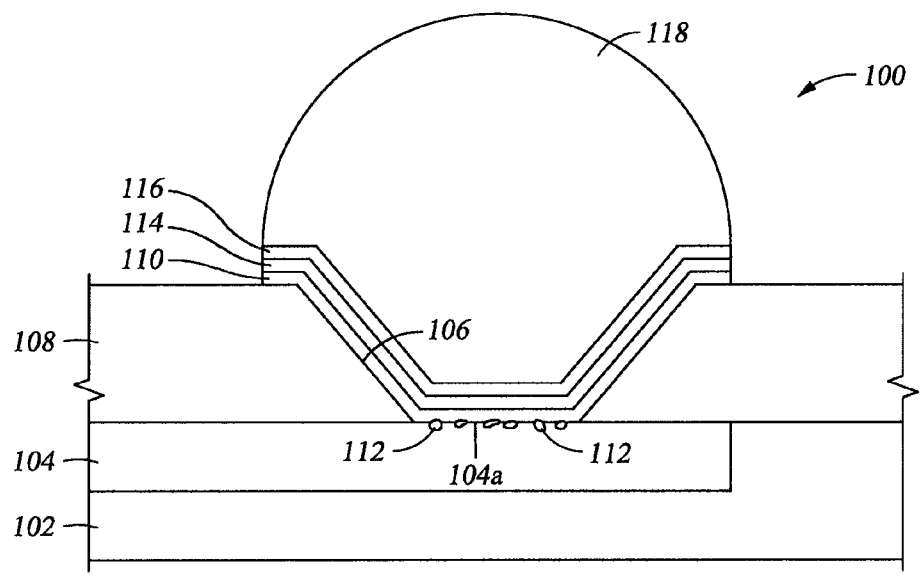
FIG. 1 is a prior art schematic side view of an under bump metallization structure.

To facilitate understanding, identical reference numerals have been used, where possible, to designate identical elements that are common to the figures. It is also contemplated that elements and features of one embodiment may be beneficially incorporated on other embodiments without further recitation.

DETAILED DESCRIPTION

Embodiments of the present disclosure provide methods for reducing contaminations in bond pads caused by moisture in an adjacent polymer layer. According to embodiments of the present disclosure, moisture in polymer material may be locked or sealed using a moisture sensitive gas or vapor. Particularly, the polymer material may be exposed to a metal precursor which reacts with moisture in the polymer material forming a metal oxide on the polymer material or within the polymer material. As a result, the moisture in the polymer material is locked in the metal oxide and contamination to the nearby bond pad area is prevented.

Figure 2A:
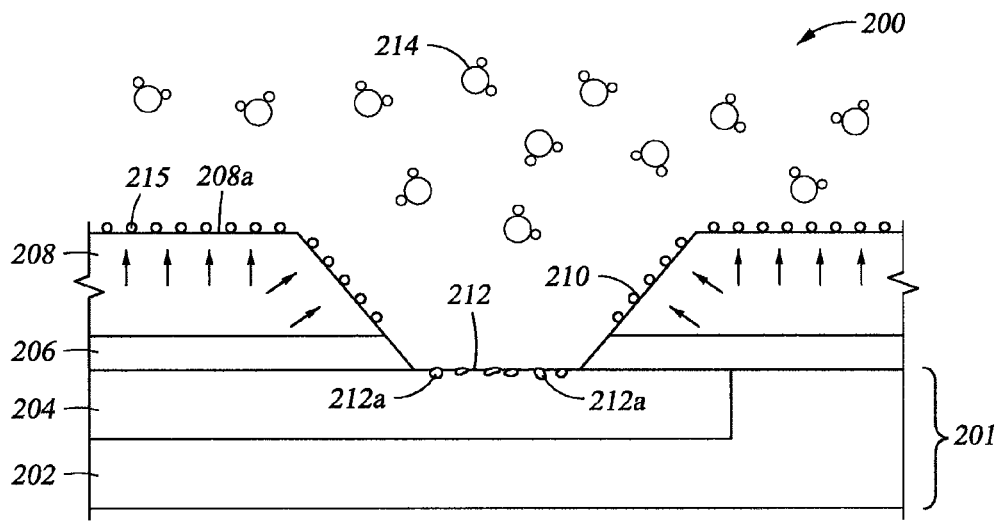
FIGS. 2A-2C are schematic views of an under bump metallization structure according to one embodiment of the present disclosure.
Figure 2B:
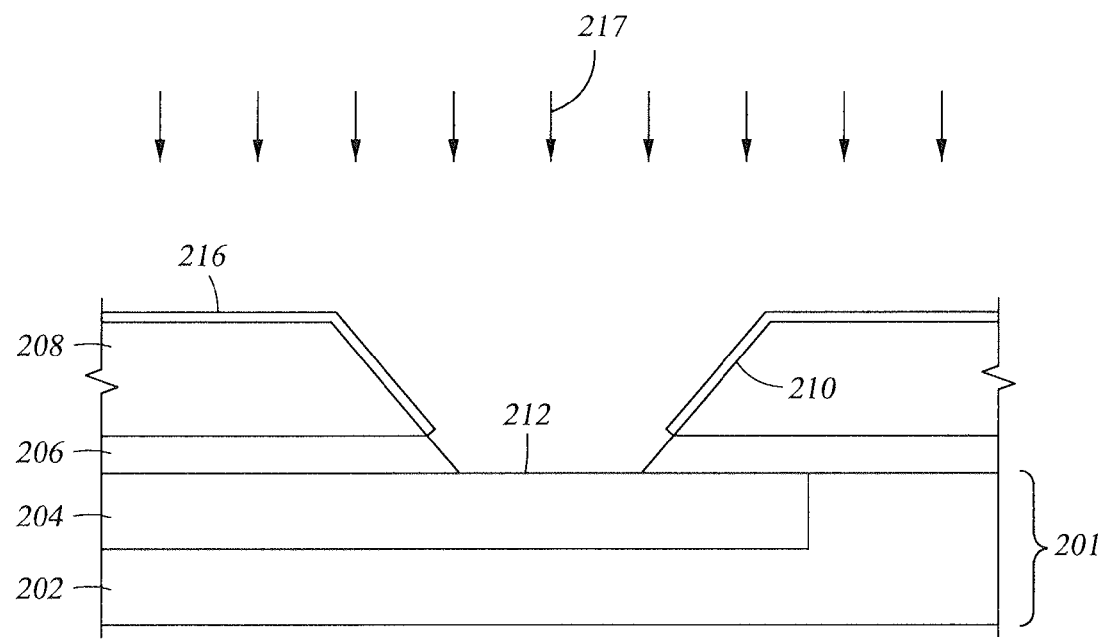
Figure 2C:
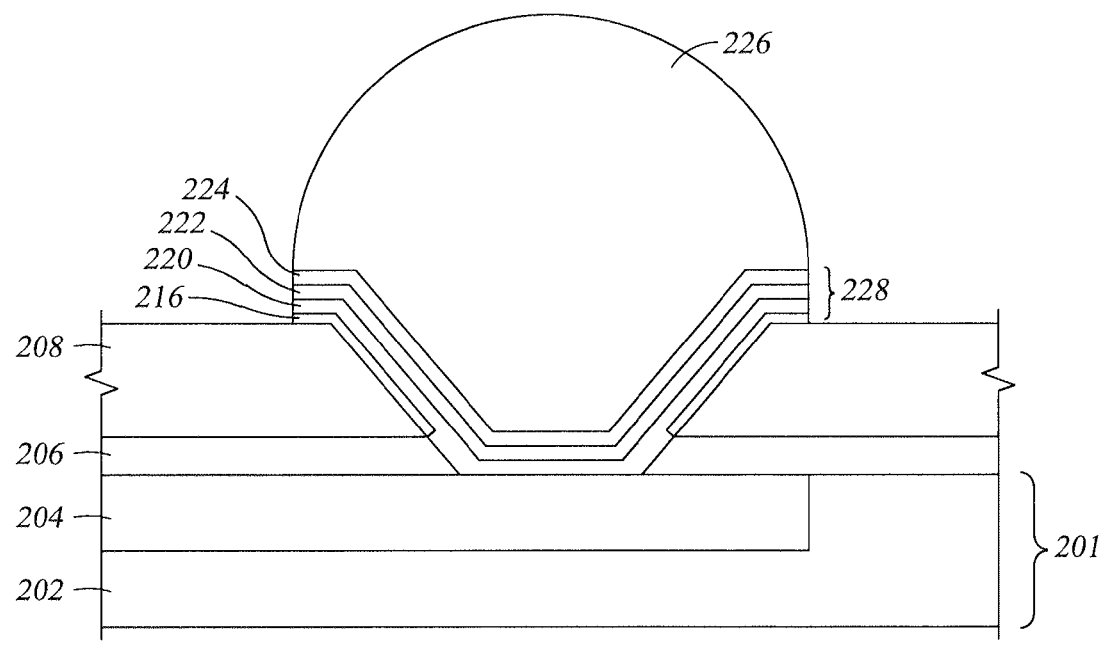

FIGS. 2A-2C are schematic views showing formation of an under bump metallization structure 200 according to one embodiment of the present disclosure.

As shown in FIG. 2A, a device interconnect layer 204 is formed in a dielectric layer 202 of a semiconductor die 201. The semiconductor die 201 may include active areas containing analog or digital circuit formed by one or more transistors, diodes, inductors, capacitors, resistors, and other circuit elements. The device interconnect layer 204 is generally made with a conductive material, such as aluminum, copper, tin, nickel, gold, silver, or combination thereof. The device interconnect layer 204 is electrically connected with the circuit elements formed in the semiconductor die 201.

A passivation layer 206 is formed over the device interconnect layer 204 and the dielectric layer 202 of the semiconductor die 201. The passivation layer 206 protects the device interconnect layer 204 and the dielectric layer 202 from moisture and oxygen. The passivation layer 206 may comprise silicon nitride ($Si_3N_4$) or silicon oxide ($SiO_2$).

A dielectric layer 208 is formed over the passivation layer 206. The dielectric layer 208 may comprise a polymer, such as polyimide. The dielectric layer 208 may be formed over the passivation layer 206 by a spin-on application.

A via 210 may be formed through the dielectric layer 208 and the passivation layer 206 exposing a bond pad area 212 of the device interconnect layer 204. The via 210 may be formed by patterning and etching.

As discussed above, the polymer in the dielectric layer 208 includes moisture. The moisture can outgas into the environment. After formation of the via 210, the bond pad area 212 is exposed to the environment, including moisture outgassed from the polymer in the dielectric layer 208. Contamination 212a may be formed on the bond pad area 212 from reaction between the conductive material in the device interconnect layer 204 and the outgassed moisture.

According to embodiments of the present disclosure, a moisture sensitive precursor 214 may be applied to the polymer in the dielectric layer 208 to remove the moisture by reaction. The moisture sensitive precursor 214 may be supplied in the form of gas or vapor. The moisture sensitive precursor 214 removes the moisture in and/or around the polymer in the dielectric layer 208 by attracting and reacting with the moisture to form an oxide 215. The moisture in the dielectric layer 208 may be drawn to a surface 208a of the dielectric layer 208 forming the oxide 215 on the surface 208a. The oxide 215 may also form inside the dielectric layer 208. As a result, the moisture in the dielectric layer 208 is "locked".

According to embodiments of the present disclosure, the moisture sensitive precursor 214 may be any metal containing precursor suitable for forming a metal oxide or a metal by chemical vapor deposition. For example, the moisture sensitive precursor 214 may comprise one or more metal compounds. The moisture sensitive precursor 214 may comprise one or more compounds of aluminum, titanium, tantalum, zirconium, hafnium, vanadium, niobium or other suitable metal. In one embodiment, the moisture sensitive precursor 214 may be an amine of a metal, such as titanium, tantalum, zirconium, hafnium, vanadium, niobium, or other suitable metal. According to another embodiment of the present disclosure, the moisture sensitive precursor 214 may be a silicon containing precursor. For example, the moisture sensitive precursor 214 may comprise an amine silane.

As shown in FIG. 2B, the oxide 215 may form an oxide layer 216 on the surface 208a of the dielectric layer 208. The oxide layer 216 may be a continuous layer or a discontinuous layer depending on the amount of moisture abstracted from the dielectric layer 208. When a continuous oxide layer 216 is formed, the oxide layer 216 may also function as a barrier layer to prevent any additional moisture in the dielectric layer 208 from outgassing into the environment during subsequent, thus stopping further contamination.

After the moisture in the dielectric layer 208 has been removed or sealed using the moisture sensitive precursor 214, a plasma cleaning process may be performed to remove any contaminations. As shown in FIG. 2B, ions 217 may be directed toward the substrate to clean the surface of the substrate. The ions 217 may comprise argon ions. The contamination 212a on the bond pad area 212 has been removed by the ions 217. The oxide layer 216 remains attached to the surface 208a of the dielectric layer 208 during the ionic cleaning process. After the plasma cleaning process, the cleaned bond pad area 212 can remain free of moisture contamination since moistures in the dielectric layer 208 is now locked in or by the oxide layer 216.

As shown in FIG. 2C, under bump metallization layers 228 may be formed over the bond pad area 212 for further connection with a solder 226. The under bump metallization layers 228 may include a stack of conformal metal layers. FIG. 2C illustrates an exemplary under bump metallization layers 228 including a conformal aluminum layer 220 directly deposited on the bond pad area 212 and the oxide layer 216, a conformal nickel vanadium layer 222 deposited over the conformal aluminum layer 220, and a conformal copper layer 224 formed over the conformal nickel vanadium layer 222.

Alternatively, redistribution layers may be formed over the bond pad area 212 for flip-chip packaging. The redistribution layers may include a conformal titanium layer formed directly over the bond pad area 212 and the oxide layer 216, and a copper redistribution layer formed over the conformal titanium layer.

Figure 3:
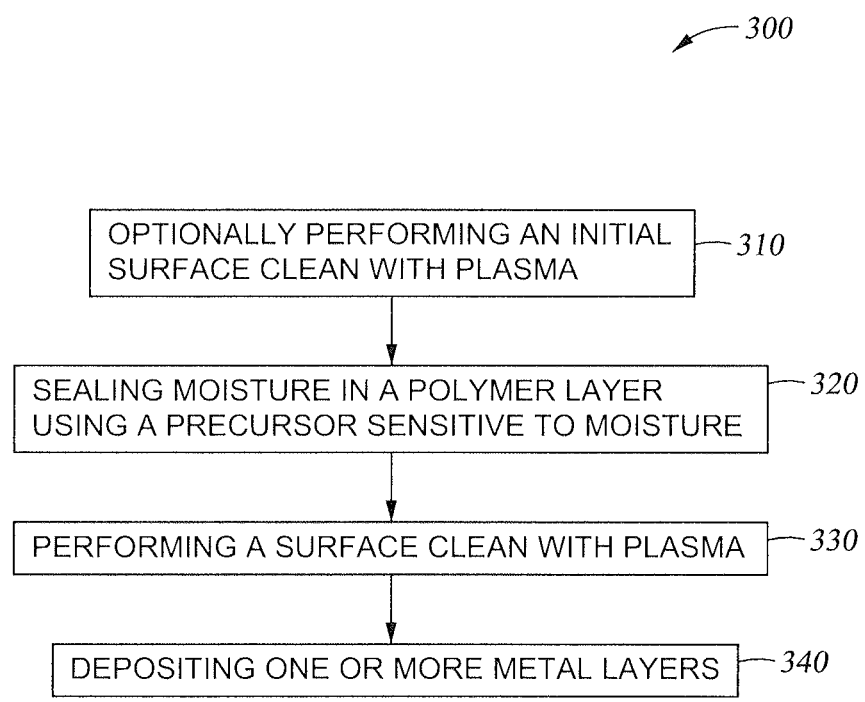
FIG. 3 is a flow chart reflecting a method for removing moisture in polymer during under bump metallization according to one embodiment of the present disclosure.

FIG. 3 is a flow chart reflecting a method 300 for removing moisture in polymer according to one embodiment of the present disclosure. The method 300 may be used to remove moisture and clean bond pad prior to under bump metallization formation or redistribution layer formation.

In box 310, an optional plasma surface clean may be performed to bond pad areas and polymer materials around the bond pad areas. For example, a substrate to be processed may have a patterned dielectric layer comprising polymer formed over bond pad layer to expose bond pad areas. The optional plasma surface clean may be performed by directing argon plasma towards a surface of the substrate being processed. The optional plasma surface cleaning can remove contaminations formed on the bond pad area and remove a portion of moisture in the polymer material. The plasma surface cleaning process may be performed in a plasma pre-clean chamber attached to a processing system for physical vapor deposition.

In box 320, the polymer material is exposed to a moisture sensitive precursor to seal moisture in the polymer material. The moister sensitive precursor may be delivered toward the polymer material in the form of vapor or gas. The moister sensitive precursor attracts the moister in the polymer material and reacts with the moisture to form an oxide on the surface of the polymer material, thus, locking the moisture in the form of oxide. Additionally, a layer of oxide may be formed on the surface of the polymer material, thus, sealing any remaining moisture in the polymer material from exiting and causing contamination.

According to one embodiment of the present disclosure, the process in box 320 may be performed in various chambers in a processing system for physical vapor deposition system. For example, the process may be performed in an outgas chamber, a load lock chamber with gas delivery capacity, or the same plasma cleaning chamber for performing process described in box 310. During operation, the substrate may remain at room temperature.

The moisture sensitive precursor is similar to the moisture sensitive precursor 214 described with FIG. 2A above. The oxide formed on the polymer material may be similar to the oxide 215 and the oxide layer 216 described in FIGS. 2A-2B. The moisture sensitive precursor may comprise one or more metal containing precursors suitable for forming metal oxide or metal by chemical vapor deposition. The moisture sensitive precursor may comprise one or more compound of aluminum, titanium, tantalum, zirconium, hafnium, vanadium, niobium or other suitable metal. In one embodiment, the moisture sensitive precursor may be amine of a metal, such as titanium, tantalum, zirconium, hafnium, vanadium, niobium, or other suitable metal.

According to one embodiment of the present disclosure, the moisture sensitive precursor may comprise an aluminum precursor and the oxide comprises aluminum oxide. Suitable aluminum precursor may be one of DMAH (dimethyl-aluminum-hydride, $(CH_3)_2Al—H$), TEA (tri-ethyl-aluminum, $Al_2(CH_2CH_3)_6$), TMA (tri-methyl-aluminum, $Al_2(CH_3)_6$), MPA (methyl pyrrolidine alane, $C_5H_{14}AlN$), TMAAB (trimethylaminealane borane, $C_3H_{15}AlBN$,), TTBA (Tri-tertiary-butyl-aluminum, $((CH_3)_3C_3Al)$, aluminum hydride $(AlH_3)$, Tri-isobutylaluminum $([(CH_3)_2CHCH_2]_3Al)$, Tris(dimethylamido)aluminum $(Al(N(CH_3)_2)_3)$, or combinations thereof.

According to one embodiment of the present disclosure, the moisture sensitive precursor may comprise a tantalum precursor and the oxide comprises tantalum oxide. Suitable tantalum precursor may be one of pentakis(dimethylamino)tantalum $(Ta(N(CH_3)_2)_5)$, tantalum ethoxide $(Ta(OC_2H_5)_5)$, tris(diethylamido)(tert-butylimido)tantalum $((CH_3)_3CNTa(N(C_2H_5)_2)_3)$, tris(diethylamido)(ethylimido)tantalum $(C_2H_5NTa(N(C_2H_5)_2)_3)$, tris(ethylmethylamido)(tert-butylimido)tantalum $(C_{13}H_{33}N_4Ta)$, or combinations thereof.

According to one embodiment of the present disclosure, the moisture sensitive precursor may comprise a zirconium precursor and the oxide comprises zirconium oxide. Suitable zirconium precursor may be one of bis(cyclopentadienyl)zirconium dihydride $(C_{10}H_{12}Zr)$, bis(methyl-η5-cyclopentadienyl)methoxymethyl zirconium $(Zr(CH_3C_5H_4)_2CH_3OCH_3)$, dimethylbis(pentamethylcyclopentadienyl)zirconium $(C_{22}H_{36}Zr)$, tetrakis(diethylamido)zirconium $([(C_2H_5)_2N]_4Zr)$, tetrakis(dimethylamido)zirconium $([(CH_3)_2N]_4Zr)$, tetrakis(ethylmethylamido)zirconium $(Zr(NCH_3C_2H_5)_4)$, Zirconium diisopropoxidebis(2,2,6,6-tetramethyl-3,5-heptanedionate) $(Zr(OCC(CH_3)_3CHCOC(CH_3)_3)_2(OC_3H_7)_2)$, zirconium tetrakis(2,2,6,6-tetramethyl-3,5-heptanedionate) $(Zr(OCC(CH_3)_3CHCOC(CH_3)_3)_4)$, or combinations thereof.

According to one embodiment of the present disclosure, the moisture sensitive precursor may comprise a titanium precursor and the oxide comprises titanium oxide. Suitable titanium precursor may be one of tetrakis(dimethylamido)titanium (TDMAT, $[(CH_3)_2N]_4Ti$), bis(tert-butylcyclopentadienyl)titanium $(C_{18}H_{26}Cl_2Ti)$, bis(diethylamido)bis(dimethylamido)titanium $(Ti(N(CH_3)_2)_2(N(CH_2CH_3)_2)_2)$, tetrakis(diethylamido)titanium $([(C_2H_5)_2N]_4Ti)$, tetrakis(ethylmethylamido)titanium $([(CH_3C_2H_5)N]_4Ti)$, titanium diisopropoxidebis(2,2,6,6-tetramethyl-3,5-heptanedionate) $(Ti[OCC(CH_3)_3CHCOC(CH_3)_3]_2(OC_3H_7)_2)$, titanium isopropoxide $(Ti[OCH(CH_3)_2]_4)$, titanium tetrachloride $(TiCl_4)$, or combinations thereof.

According to one embodiment of the present disclosure, the moisture sensitive precursor may comprise a hafnium precursor and the oxide comprises hafnium oxide. Suitable hafnium precursor may be one of bis(tert-butylcyclopentadienyl)dimethyl hafnium $(C_{20}H_{32}Hf)$, bis(methylcyclopentadienyl)dimethyl hafnium $(Hf[C_5H_4(CH_3)]_2(CH_3)_2)$, bis(methylcyclopentadienyl)methoxymethylhafnium $(HfCH_3(OCH_3)[C_5H_4(CH_3)]_2)$, bis(trimethylsilyl)amidohafnium chloride $([[(CH_3)_3Si]_2N]_2HfCl_2)$, dimethylbis(cyclopentadienyl)hafnium $((C_5H_5)_2Hf(CH_3)_2)$, hafnium tert-butoxide $(Hf[OC(CH_3)_3]_4)$, hafnium isopropoxide isopropanol adduct $(C_{12}H_{28}HfO_4)$, tetrakis(diethylamido)hafnium $([(CH_2CH_3)_2N]_4Hf)$, tetrakis(dimethylamido)hafnium $([(CH_3)_2N]_4Hf)$, tetrakis(ethylmethylamido)hafnium $([(CH_3)(C_2H_5)N]_4Hf)$, and combinations thereof.

According to one embodiment of the present disclosure, the moisture sensitive precursor may comprise a vanadium precursor and the oxide comprises vanadium oxide. Suitable hafnium precursor may be one of bis(cyclopentadienyl)vanadium $(V(C_5H_5)_2)$, bis(ethylcyclopentadienyl)vanadium $(C_{14}H_{18}V)$, vanadium oxytriisopropoxide $(OV(OCH(CH_3)_2)_3)$, and combinations thereof.

According to one embodiment of the present disclosure, the moisture sensitive precursor may comprise a silicon precursor and the oxide comprises a silicon oxide. Suitable silicon precursor may be an aminesilane, such as $SiH_2(N(C_2H_5)_2)_2$, $Si_2(C_2H_5)_6$, $SiH(N(CH_3)_2)_3$, or trisilylamine (TSA).

In box 330, a plasma cleaning is performed after sealing the moisture in the polymer material. The plasma cleaning may be similar to the plasma cleaning described in FIG. 2B. In one embodiment, the plasma cleaning may be performed by sputtering the surface of the substrate with argon plasma. The plasma cleaning may be used to remove any residue contamination on the bond pad area or remove any loose particles generated during the moisture sealing process described above. The plasma cleaning process may be performed in a pre-clean chamber in the processing system for performing physical vapor deposition.

In box 340, one or more metal layers may be formed over the bond pad areas for under bump metallization, redistribution layer, or other device structures. The one or more metal layers may be conformal layers similar to metal layers 220, 222, 224 as shown in FIG. 2C. The one or more metal layers may be formed by physical vapor deposition. The one or more metal layers may be formed using one or more physical vapor deposition chambers included on the processing system.

The method 300 may be performed in a processing system including a transfer chamber, one or more physical vapor deposition chambers coupled to the transfer chamber, a pre-clean chamber coupled to the transfer chamber, and at least one load lock chamber coupled to the transfer chamber.

During processing, the substrate being processed may enter the processing system through the load lock chamber to the transfer chamber, then to the pre-clean chamber, wherein the optional plasma cleaning of box 310 is performed. The moisture sealing process described in box 320 may then be processed in the pre-clean chamber. Alternatively, the substrate may be transferred from the pre-clean chamber to the load lock chamber or other service chamber for the moisture sealing process. When the optional plasma cleaning is not performed, the substrate being processed may be directly transferred to the perspective chamber for moisture sealing process. After the moisture sealing process, the plasma cleaning described in box 330 is performed in the pre-cleaning chamber. The substrate is then transferred to the one or more physical vapor deposition chambers for forming one or more metal layers as described in box 340.

Even though removing moisture from dielectric layers in a substrate being processed is described above, embodiments of the present disclosure may be used in any suitable situation for removing moisture. For example, embodiments of the present disclosure may be used in removing moisture from inner surfaces of a processing chamber.

While the foregoing is directed to embodiments of the present disclosure, other and further embodiments of the disclosure may be devised without departing from the basic scope thereof, and the scope thereof is determined by the claims that follow.

The invention claimed is:

1. A method for processing a substrate, comprising:
    removing moisture in one or more films on the substrate by:
        providing a moisture sensitive precursor that is a gas or vapor, wherein the moisture sensitive precursor comprises a metal or silicon; and
        forming a compound on the substrate from a reaction between the moisture in the one or more films and the moisture sensitive precursor, wherein the compound comprises an oxide of the metal or silicon.

2. The method of claim 1, wherein the one or more films comprise a polymer film.

3. The method of claim 2, wherein the polymer film is disposed over a metal film, and the polymer film is patterned to expose a portion of the metal film.

4. The method of claim 3, further comprising cleaning a surface of the substrate using a plasma.

5. The method of claim 4, wherein the cleaning the surface of the substrate using a plasma is performed after removing moisture in one or more films on the substrate.

6. The method of claim 5, further comprising cleaning the surface of the substrate using a plasma prior to removing moisture in one or more films on the substrate.

7. The method of claim 1, wherein the moisture sensitive precursor comprises one of one or more of silicon, aluminum, titanium, tantalum, zirconium, hafnium, vanadium, or niobium.

8. A method for forming under bump metal layers, comprising:
    removing moisture from a polymer layer formed over a device interconnect layer, wherein the polymer layer is patterned to expose a portion of the device interconnect layer, and removing moisture comprises:
        providing a moisture sensitive precursor that is a gas or vapor; and
        forming a compound from a reaction between the moisture in the polymer layer and the moisture sensitive precursor;
    cleaning the exposed device interconnect layer with a plasma; and
    depositing one or more metal layers over the polymer layer and the exposed device interconnect layer.

9. The method of claim 8, further comprising cleaning the polymer layer and the exposed device interconnect layer with a plasma prior to removing moisture from the polymer layer.

10. The method of claim 8, wherein the device interconnect layer comprises aluminum.

11. The method of claim 10, wherein the polymer layer comprises polyimide.

12. The method of claim 10, wherein the moisture sensitive precursor comprises aluminum.

13. The method of claim 8, wherein the moisture sensitive precursor comprises one or more of silicon, aluminum, titanium, tantalum, zirconium, hafnium, vanadium, or niobium.

14. A method for forming under bump metal layers, comprising:
    removing moisture from a polymer layer formed over a device interconnect layer, wherein the polymer layer is patterned to expose a portion of the device interconnect layer, and removing moisture comprises:
        providing a moisture sensitive precursor, wherein the moisture sensitive precursor comprises an amine of titanium, tantalum, zirconium, hafnium, vanadium, or niobium; and
        forming a compound from a reaction between the moisture in the polymer layer and the moisture sensitive precursor;
    cleaning the exposed device interconnect layer with a plasma; and
    depositing one or more metal layers over the polymer layer and the exposed device interconnect layer.

15. A method for forming under bump metal layers, comprising:
    removing moisture from a polymer layer formed over a device interconnect layer, wherein the polymer layer is patterned to expose a portion of the device interconnect layer, and removing moisture comprises:
        providing a moisture sensitive precursor, wherein the moisture sensitive precursor comprises one of DMAH (dimethyl-aluminum-hydride, $(CH_3)_2Al$—H), TEA (tri-ethyl-aluminum, $Al_2(CH_2CH_3)_6$, TMA (tri-methyl-aluminum, $Al_2(CH_3)_6$,), MPA (methyl pyrrolidine alane, $C_5H_{14}AlN$), TMAAB (trimethylaminealane borane, $C_3H_{15}AlBN$,), TTBA (Tri-tertiary-butyl-aluminum, $((CH_3)_3C_3Al)$, aluminum hydride ($AlH_3$), Triisobutylaluminum ($[(CH_3)_2CHCH_2]_3Al$), Tris(dimethylamido)aluminum ($Al(N(CH_3)_2)_3$), or combinations thereof; and
        forming a compound from a reaction between the moisture in the polymer layer and the moisture sensitive precursor;
    cleaning the exposed device interconnect layer with a plasma; and
    depositing one or more metal layers over the polymer layer and the exposed device interconnect layer.

* * * * *